US007425299B2

(12) United States Patent
Kato et al.

(10) Patent No.: US 7,425,299 B2
(45) Date of Patent: Sep. 16, 2008

(54) LEAD-FREE SOLDER BALLS AND METHOD FOR THE PRODUCTION THEREOF

(75) Inventors: Rikiya Kato, Souka (JP); Shinichi Nomoto, Hanyu (JP); Hiroshi Okada, Souka (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 444 days.

(21) Appl. No.: 10/962,747

(22) Filed: Oct. 13, 2004

(65) Prior Publication Data

US 2005/0106060 A1 May 19, 2005

Related U.S. Application Data

(63) Continuation of application No. 10/170,408, filed on Jun. 14, 2002, now abandoned.

(30) Foreign Application Priority Data

Jun. 15, 2001 (JP) .............................. 2001-181173

(51) Int. Cl.
*C22C 13/00* (2006.01)
(52) U.S. Cl. ...................... 420/560; 148/400; 75/340

(58) Field of Classification Search ................. 148/400; 75/340; 420/560
See application file for complete search history.

(56) References Cited

U.S. PATENT DOCUMENTS

| 5,445,666 A | 8/1995 | Peschka et al. | ............... 75/335 |
| 5,653,783 A | 8/1997 | Ohzeki | ....................... 75/340 |
| 6,517,602 B2 | 2/2003 | Sato et al. | ...................... 75/255 |

FOREIGN PATENT DOCUMENTS

| JP | 7300606 | 11/1995 |
| JP | 10144718 | 5/1998 |

*Primary Examiner*—Sikyin Ip
(74) *Attorney, Agent, or Firm*—Michael Tobias

(57) ABSTRACT

Lead-free solder balls having a good surface appearance with no appreciable surface defects such as seams and shrinkage cavities comprises an alloy having a composition consisting essentially of about 4.0% to about 6.0% by weight of Ag, about 1.0% to about 2.0% by weight of Cu, and a balance of Sn, and they have a diameter of from 0.05 mm to 1.0 mm. The solder balls can be produced by forming a molten alloy having the above-described composition into solidified balls having a diameter of from 0.05 mm to 1.0 mm using the surface tension of the molten alloy.

7 Claims, 1 Drawing Sheet

LEAD-FREE SOLDER BALLS AND METHOD FOR THE PRODUCTION THEREOF

This application is a continuation of U.S. patent application Ser. No. 10/170,408 filed on Jun. 14, 2002 now abandoned.

FIELD OF THE INVENTION

This invention relates to fine solder balls, and particularly to solder balls lead-free solder balls and a method for their production.

BACKGROUND ART

Multi-functional electronic components such as SOP's (small outline packages) and QFP's (quad flat packages) have leads on opposite long sides or surrounding four sides of their relatively flat bodies. However, with an increase in integration in a single semiconductor chip, the number of leads capable of being arranged in such a component was sometimes insufficient to allow the chip to exert all of its possible functions. Thus, electronic components having a much larger number of leads than attainable with SOP's and QFP's were desired. An increase in the number of leads was realized by a technique in which leads are arranged in a grid array on the back surface of a substrate on which a semiconductor chip is mounted to form an electronic component, i.e., on the surface of the substrate facing away the semiconductor chip. Examples of such electronic components having a large number of leads on the back surface of their substrates are BGA's (ball grid array packages) and CSP's (chip size packages).

Normally a BGA or CSP (hereinafter referred to merely as a BGA for simplicity) is mounted on a printed (wiring) board by use of solder balls, which are fine balls of a solder alloy. In practice, it is impossible to dispense and position solder balls at the time of mounting a BGA on a printed board. Therefore, solder balls are normally secured on the back surface of the substrate of a BGA by making them adhere to the electrode pads or lands formed on that surface of the BGA substrate to form solder bumps in a grid array. A BGA having the thus formed solder bumps is soldered to a printed board typically by applying a solder paste to the printed board, bringing the solder bumps of the BGA into contact with the surface of the printed board on which the solder paste is applied, and heating the resulting assembly in a reflow furnace so as to melt the solder paste and the solder bumps for soldering.

Solder balls which have conventionally been used to form bumps on BGA's are made of an Sn—Pb alloy which has an approximately eutectic composition of about 63% by weight of Sn and a balance of Pb and which has a melting point of 183° C. Sn—Pb alloys are excellent as a solder since they have low melting temperatures and good wetting power in a molten state, so they minimize the occurrence of soldering defects.

Recently, however, the use of Sn—Pb solders has been disfavored due to the toxic nature of Pb. When waste electronic devices are disposed of, they are often disassembled to remove plastic and metallic parts for recycling. Printed boards on which electronic components are mounted are not adapted to recycling since plastic and metallic portions are combined complicatedly therein, so they are removed from waste electronic devices, shredded, and buried in the ground. When rain which has been acidified (i.e., acid rain) contacts the shredded printed boards buried in the ground, the lead (Pb) in the Sn—Pb solder may be dissolved out and contaminate underground water. If a human or animal continues to drink lead-containing water for many years, there is a concern of lead accumulating in its body to cause lead poisoning.

Accordingly, it has been recommended in the art to use a "lead-free" solder, which is completely free from lead, in soldering of electronic components.

Most lead-free solders are made of Sn-based alloys such as Sn—Ag, Sn—Cu, Sn—Bi, and Sn—Zn alloys which may optionally contain one or more additional elements such as those selected from Ag, Cu, Zn, In, Ni, Cr, Fe, Ge, and Ga. Thus, there are a wide variety of lead-free solders which have their respective advantages and disadvantages, and an appropriate lead-free solder is selected depending on the application.

For lead-free solder balls which are used to form solder bumps on BGA's, an Sn—Ag—Cu alloy is suitable in terms of properties such as solderability, bonding strength, and thermal fatigue resistance. In particular, an Sn-3Ag-0.5Cu alloy (containing 3% Ag, 0.5% Cu, and a balance of Sn on a weight basis) having a liquidus temperature of about 220° C. is mostly used.

However, solder balls made of an Sn-3Ag-0.5Cu alloy have a problem that they often have surface defects such as shrinkage cavities and seams, which are formed while the solder balls are solidified during their production. Shrinkage cavities are pores opening onto the surface of a solder ball and extending deep inside the balls, while seams are streaky surface irregularities like wrinkles (protrusions and indentations) found numerously on the surface of a solder ball.

With solder balls having shrinkage cavities, the pore-like shrinkage cavities are closed by molten solder when the solder balls are heated to melt for the first time, i.e., so as to form solder bumps on the back surface of a BGA substrate, thereby leaving air confined within the closed shrinkage cavities. Thus, the resulting solder bumps have closed air cells therein, and they may form soldered joints having voids during soldering of the BGA to a printed board, thereby causing the joints to have a decreased bonding strength.

Solder balls having seams cause a problem when they are delivered to the back surface of a BGA substrate and located on each land formed on the back surface. In the production of BGA's, the delivery of solder balls is normally performed using a ball feeder which includes a suction plate to grasp solder balls, but seams on the surface of solder balls may prevent the balls from being grasped by the suction plate as described more fully below.

The suction plate of a ball feeder has through holes with a diameter slightly smaller than that of solder balls to be grasped thereby. These holes are situated in exactly the same grid array as that of the lands formed on the back surface of a BGA substrate on which solder bumps are to be formed. The interior of the suction plate is evacuated to generate a suction force sufficient to grasp solder balls in all the holes. The suction plate which grasps solder balls in all the holes is then moved over a BGA substrate placed upside down (with its back surface facing upward). The BGA substrate has been treated by applying an adhesive soldering flux to the grid array spots (electrodes or lands) of its back surface on which solder bumps are to be formed. After the suction plate is positioned so that its holes coincide with the grid array spots of the BGA substrate, the suction plate is moved toward the BGA substrate until the solder balls grasped by the suction plate come into contact with the flux on the BGA substrate. The solder balls are then released by an appropriate technique such as injection of air through the holes of the suction plate or application of an impact to the suction plate, thereby causing the solder balls to adhere to the flux. Thereafter, the BGA substrate having solder balls placed thereon is heated in a reflow furnace or similar heating device to melt the soldering flux and the solder balls and form solder bumps in a grid array on the substrate.

If solder balls having seams are used in the above-described process, it cannot be guaranteed that they are grasped by all the holes of the suction plate, since air can pass through the gaps formed between the balls and holes due to the irregular surfaces of the balls having seams, and thus the suction force generated by the suction plate is attenuated. As a result, some holes of the suction plate may be vacant by a failure to grasp or maintain a solder ball in the holes, and thus the ball feeder may fail to deliver solder balls to the spots of the BGA substrate corresponding to the vacant holes, resulting in the production of a BGA having no solder bumps in some spots after heating is performed to melt the solder balls. If a BGA is missing a soldering bump even in only one spot in its grid array, it will not be able to perform its function successfully. For this reason, it is critical that solder balls be free from seams.

Solder balls having seams cause another problem during the inspection of solder balls performed in the above-described process to confirm that a suction plate of a ball feeder has a solder ball in each hole of the plate before solder balls are delivered on a BGA substrate, or subsequently to confirm that the BGA substrate has a solder ball on each spot of its grid array before the substrate is heated for soldering. Such inspection is normally carried out by image processing using a photo detector which detects the light reflected by a solder ball as an indication of the presence of a ball. Seams on a solder ball may diffuse the reflected light to such an extent that the reflected light reaching the photo detector is insufficient for detection of the ball. As a result, although a solder ball is actually present in a hole of the suction plate or on a spot of the BGA substrate, the photo detector may be unable to detect the presence of the ball and mistakenly determine the hole or spot to be vacant.

SUMMARY OF THE INVENTION

The present invention provides lead-free solder balls having a good surface appearance which is substantially free of surface defects such as shrinkage cavities and seams which may interfere with the use and in particular, delivery or inspection of the solder balls, as described above.

The present invention also provides a method for producing such solder balls.

The present inventors found that an Sn—Ag—Cu alloy having a composition in a specific range makes it possible to produce solder balls having a good surface appearance. In other words, it was found that the surface appearance of solder balls of an Sn—Ag—Cu alloy differs significantly depending on the alloy composition, since a conventional Sn-3Ag-0.5Cu alloy forms solder balls having shrinkage cavities and seams as described above.

The present invention provides lead-free solder balls having a good surface appearance and comprising an alloy having a composition consisting essentially of about 4.0% to about 6.0% by weight of Ag, about 1.0% to about 2.0% by weight of Cu, and a balance of Sn, the solder balls having a diameter of from about 0.05 mm to about 1.0 mm.

Preferably, the alloy has a composition consisting essentially of about 5.7% by weight of Ag, about 1.3% by weight of Cu, and a balance of Sn.

The present invention also provides a method for producing lead-free solder balls comprising forming a molten alloy having a composition which consists essentially of about 4.0% to about 6.0% by weight of Ag, about 1.0% to about 2.0% by weight of Cu, and a balance of Sn into solidified balls having a diameter of from about 0.05 mm to about 1.0 mm. The solidified balls are formed by the action of the surface tension of the molten alloy.

DETAILED DESCRIPTION OF THE INVENTION

Figure 1:
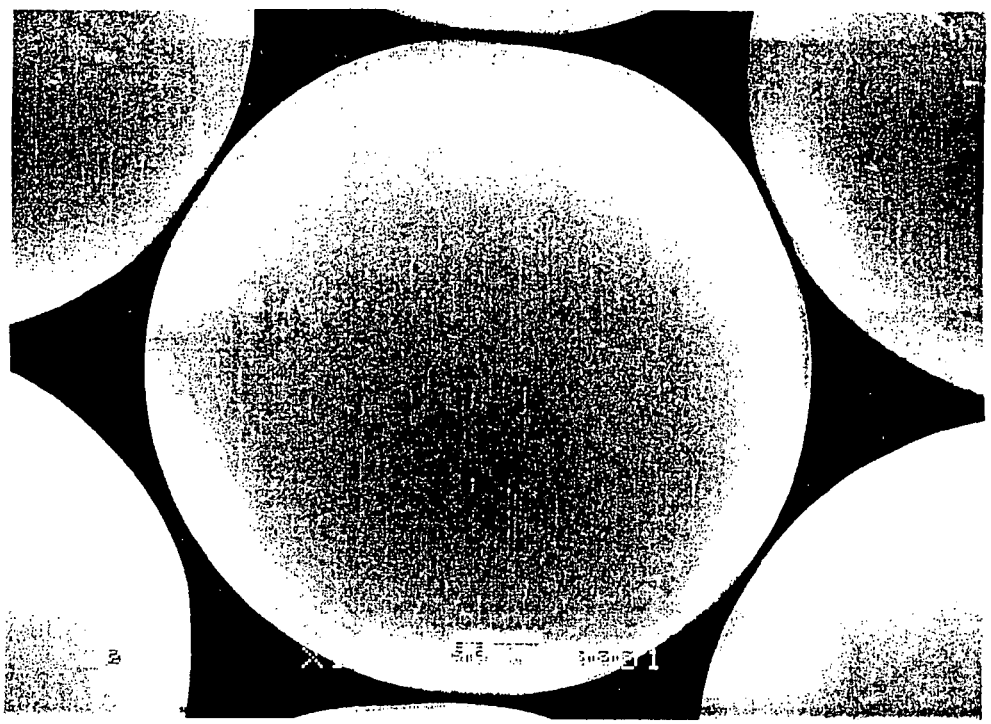
FIG. 1 is an electron micrograph showing lead-free solder balls of an Sn-5.7Ag-1.3Cu alloy according to the present invention.

Lead-free solder balls according to the present invention have a diameter of from about 0.05 mm to about 1.0 mm since such a diameter is generally used to form solder bumps on BGA substrates and CSP substrates. The solder balls also may be used for flip chip bonding of a semiconductor chip to a substrate, if they have a diameter which is small enough for such bonding.

The solder balls have an alloy composition consisting essentially of about 4.0% to about 6.0% by weight of Ag, about 1.0% to about 2.0% by weight of Cu, and a balance of Sn. They have a good surface appearance which is free from appreciable shrinkage cavities and seams which may interfere with the function or performance of the solder balls.

Such a composition gives an alloy having a liquidus temperature around 260° C., which is higher than that of an Sn-3Ag-0.5Cu alloy but is still suitable for soldering BGA's and CSP's to printed boards as long as the electronic components mounted on the BGA's or CSP's are heat-resistant and can withstand such a temperature. If the electronic components are sensitive to such a high temperature, the BGA's or CSP's having solder bumps formed from solder balls according to the present invention may be soldered to printed boards by heating to a lower temperature sufficient to melt the solder paste applied to the printed boards. In this case, the solder bumps on the BGA's or CSP's do not melt and they are soldered to the wiring boards only with the solder paste.

Preferably the Ag content is from about 5.0% to about 6.0% by weight and the Cu content is from about 1.0% to about 1.6% by weight. Most preferably the alloy composition consists essentially of about 5.7% by weight of Ag, about 1.3% by weight of Cu, and a balance of Sn in order to provide solder balls with the most improved surface appearance.

The solder balls according to the present invention can be produced by a method which comprises preparing a molten alloy having the above-described composition and forming the molten alloy into balls by any technique capable of forming balls having a uniform diameter using the action of the surface tension of the molten alloy.

Examples of such a ball forming technique include an oil method as disclosed in U.S. Pat. No. 5,653,783 and JP-A 7-300606 and a direct method as disclosed in U.S. Pat. No. 5,445,666, although other techniques may be employed.

In the oil method, a wire of a solder alloy having a predetermined composition is prepared and cut into sections having a given length. The wire sections are individually dropped into an oil bath having a vertical temperature gradient in which the temperature in an upper portion is higher than in a lower portion, whereby the sections are allowed to melt in the upper portion and then solidify while they are falling in the oil bath. Thus, the upper portion has a temperature high enough to melt the solder alloy and the lower portion has a temperature low enough to solidify the molten solder alloy.

In the direct method, a molten solder alloy having a predetermined composition is prepared. The molten solder is dripped or allowed to fall in droplets of a given size through an orifice or nozzle, and then solidified in a gas stream flowing against the gravity or on a rotating plate, for example.

In both of these methods, the resulting solder balls have a spherical shape due to the action of the surface tension of the molten alloy itself. If a conventional lead-free solder alloy of Sn-3Ag-0.5Cu is used in either of these methods, or in any other method in which balls are formed by the action of the surface tension of a molten alloy, it will result in the formation of solder balls having the above-described shrinkage cavities and seams which are formed during solidification of the balls.

In contrast, according to the present invention, the use of an Sn—Ag—Cu solder alloy having a different composition containing about 4.0-6.0% Ag and about 1.0-2.0% Cu makes it possible to prevent the formation of shrinkage cavities and seams during solidification and to form solder balls having a good surface appearance, as demonstrated in the example given below. When these solder balls are used to form solder bumps on BGA's, it is possible to avoid a decrease in bonding strength due to the formation of voids which is attributable to shrinkage cavities in the solder balls, so the resulting solder bumps have good reliability. Since the solder balls have a good gloss with no appreciable seams, they can be delivered and positioned successfully onto BGA substrates by a suction plate of a ball feeder to ensure that there are no vacant holes in the suction plate which have not grasped or retained a solder ball. Such a good surface appearance of the solder balls also enables them to be inspected correctly by image processing without misidentification due to diffusion of the light reflected by the balls.

The following examples are presented to further illustrate the present invention. These examples are to be considered in all respects as illustrative and not restrictive.

In the examples, an oil method is used to produce solder balls of lead-free solder alloys. The oil method is performed in a silicone oil bath in a vertical cylindrical vessel having a funnel structure with a stopcock at its bottom. The vessel has a coil heater wound on its exterior wall in an upper portion of the vessel. The level of the silicone bath is slightly above the coil heater. Thus, the silicone bath is heated by the coil heater in such a manner that the upper or heated portion of the bath has a temperature range which is higher than the melting point of the solder alloy used or which is high enough to melt the solder alloy, and an unheated lower portion has a temperature which is lower than the melting point or which is low enough to solidify the molten alloy. Preferably the temperature in the lower portion is slightly above ambient temperature at least for the lowermost portion of the oil bath. If necessary, the lower portion of the vessel may be cooled entirely or partly by a suitable cooling means such as a water jacket.

A fine wire of a solder alloy is cut into sections having a given length which is selected so as to provide a ball of a predetermined diameter upon melting. The wire sections of the solder alloy are dropped one by one onto the silicone oil bath to allow them to descend within the oil bath by gravity. While falling in the oil bath slowly due to the viscosity of the silicone oil, the wire sections initially melt in the upper heated portion of higher temperatures and transform into a spherical shape by the action of the surface tension of the molten alloy. The resulting molten solder particles continue to fall toward the lower portion while keeping their spherical shape, and they solidify in the lower portion in which the temperatures are below the melting point of the solder alloy. The solidified spherical solder particles, i.e., solder balls accumulate at the bottom of the silicone oil bath. The solder balls are recovered from the vessel by opening the stopcock, and any silicone oil remaining thereon is removed by washing with a detergent solution followed by rinsing with water.

EXAMPLE 1

A solder alloy having a composition of 5.7% by weight of Ag, 1.3% by weight of Cu, and a balance of Sn and having a melting temperature of 256° C. was subjected to wire drawing to obtain a wire having a diameter of 0.2 mm. The alloy wire was cut into sections having a length of 2 mm.

One hundred (100) of the wire sections of the solder alloy were dropped one by one onto the above-described silicone oil bath which was heated to 280° C. in an upper portion thereof. The temperature of a lower portion of the oil bath was 25-26° C. although no cooling means was employed. Solder balls having a diameter of 0.5 mm were thus produced.

When these solder balls were observed under an electron microscope, they had a good surface gloss, and no shrinkage cavities or seams were found on their surfaces, as shown in FIG. 1.

Comparative Example 1

Following the procedure described in Example 1, one hundred solder balls were produced from a solder alloy having a composition of 3.0 by weight of Ag, 1.0% by weight of Cu, and a balance of Sn and having a melting temperature of 234° C.

Figure 2:
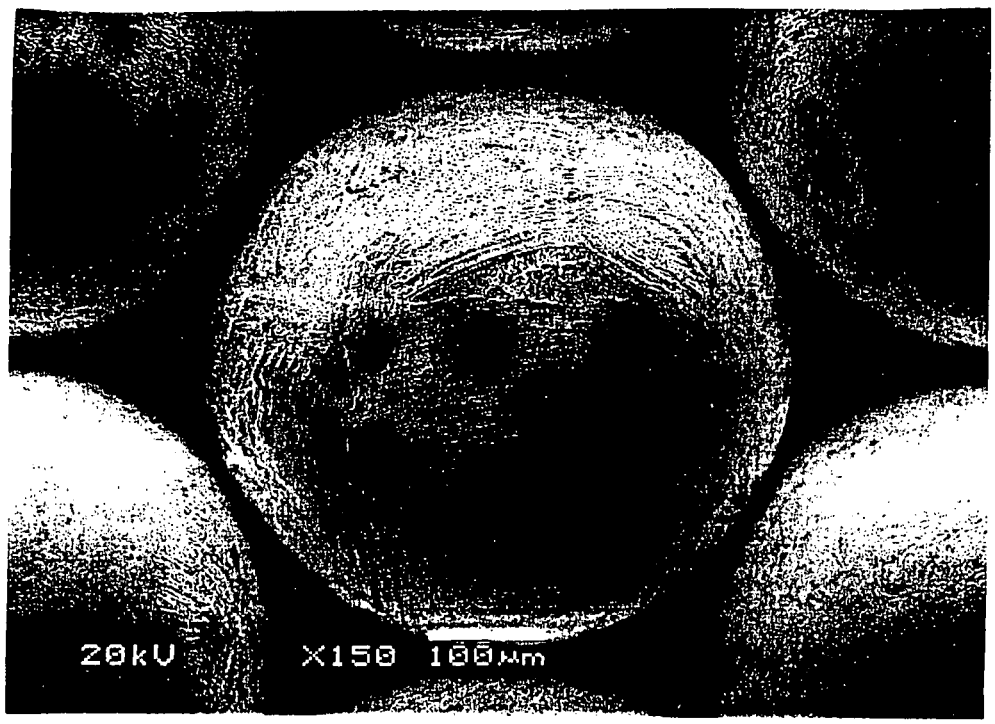
FIG. 2 is an electron micrograph showing conventional lead-free solder balls of an Sn-3Ag-1.0Cu alloy.

When these solder balls were observed under an electron microscope, seams were found on the surfaces of most of the balls as shown in FIG. 2. In addition, many of them had shrinkage cavities along with seams.

Although the present invention has been described with respect to preferred embodiments, they are mere illustrative and not intended to limit the present invention. It should be understood by those skilled in the art that various modifications of the embodiments described above can be made without departing from the scope of the present invention as set forth in the claims.

What is claimed is:

1. Lead-free solder balls for forming solder bumps on a substrate, the composition of the solder balls consisting of 4.0% to 6.0% by weight of Ag, 1.0% to 2.0% by weight of Cu, and a balance of Sn, the solder balls having a diameter of from about 0.05 mm to about 1.0 mm.

2. The lead-free solder balls of claim 1 wherein the composition of the solder balls consists of 5.7% by weight of Ag, 1.3% by weight of Cu, and a balance of Sn.

3. The lead-free solder balls of claim 1 wherein the solder balls have a good surface appearance which is substantially free of surface defects which may interfere with the use of the solder balls.

4. A method for producing lead-free solder balls comprising the step of forming a molten alloy composition which consists of 4.0% to 6.0% by weight of Ag, 1.0% to 2.0% by weight of Cu, and a balance of Sn into solidified balls having a diameter of from about 0.05 mm to about 1.0 mm using the surface tension of the molten alloy.

5. The method of claim 4 including dropping pieces of a solder alloy into a hot oil bath to allow the pieces to melt and allowing the molten pieces to descend within the bath to form them into solidified balls.

6. The method of claim 5 wherein the hot oil bath has a vertical temperature gradient with a temperature in an upper portion thereof which is high enough to melt the solder alloy and a temperature in a lower portion thereof which is low enough to solidify the molten alloy.

7. The method of claim 4 wherein forming the molten alloy into solidified balls comprises dripping the molten alloy through an orifice or nozzle.

* * * * *